United States Patent
Miyagi

(10) Patent No.: US 7,212,794 B2
(45) Date of Patent: May 1, 2007

(54) RECEIVER WITH A CRYSTAL OSCILLATOR HAVING A NATURAL-OSCILLATION FREQUENCY SET SO THAT A FUNDAMENTAL COMPONENT AND ITS HARMONICS ARE OUTSIDE THE RANGE OF A RECEIVING BAND OF A MODULATED WAVE SIGNAL

(75) Inventor: Hiroshi Miyagi, Jouetsu (JP)

(73) Assignee: Niigata Seimitsu Co., Ltd., Niigata (JP)

( * ) Notice: Subject to any disclaimer, the term of this patent is extended or adjusted under 35 U.S.C. 154(b) by 220 days.

(21) Appl. No.: 10/482,011

(22) PCT Filed: Jun. 26, 2002

(86) PCT No.: PCT/JP02/06398

§ 371 (c)(1),
(2), (4) Date: Dec. 23, 2003

(87) PCT Pub. No.: WO03/003596

PCT Pub. Date: Jan. 9, 2003

(65) Prior Publication Data

US 2004/0176057 A1    Sep. 9, 2004

(30) Foreign Application Priority Data

Jun. 29, 2001  (JP)  ............................. 2001-198214
Jul. 25, 2001  (JP)  ............................. 2001-224896

(51) Int. Cl.
*H04B 5/00*  (2006.01)
*H04B 7/00*  (2006.01)

(52) U.S. Cl. ...................................... 455/142; 455/255
(58) Field of Classification Search ................ 455/130, 455/255, 259, 260, 265
See application file for complete search history.

(56) References Cited

U.S. PATENT DOCUMENTS

2001/0031629 A1* 10/2001 Elder et al. ................. 455/324

FOREIGN PATENT DOCUMENTS

| JP | 2000-068872 | 3/2000 |
| JP | 2000-082779 | 3/2000 |
| JP | 2002-171181 | 6/2002 |

* cited by examiner

*Primary Examiner*—Duc M. Nguyen
*Assistant Examiner*—Michael Thier
(74) *Attorney, Agent, or Firm*—patenttm.us; James H. Walters

(57) ABSTRACT

A receiver in which the sneaking noise from a crystal oscillator is reduced. A high-frequency amplifier circuit 11, a mixing circuit 12, a local oscillator 13, intermediate-frequency filters 14 and 16, an intermediate-frequency amplifier circuit 15, a limit circuit 17, an FM detection circuit 18, and a stereo demodulation circuit 19, an oscillator 20, and a PLL circuit 21 all constituting an FM receiver are provided as a one-chip component 10. A crystal oscillator 31 as an external component is connected to the oscillator 20. The natural-oscillation frequency of the crystal oscillator 31 is so set that the fundamental component and its harmonics are out of the reception band.

3 Claims, 2 Drawing Sheets

RECEIVER WITH A CRYSTAL OSCILLATOR HAVING A NATURAL-OSCILLATION FREQUENCY SET SO THAT A FUNDAMENTAL COMPONENT AND ITS HARMONICS ARE OUTSIDE THE RANGE OF A RECEIVING BAND OF A MODULATED WAVE SIGNAL

TECHNICAL FIELD

The present invention relates to a receiver including an oscillator on which a crystal oscillator is externally mounted.

BACKGROUND ART

When considering an FM broadcast in Japan for instance, a receiving band of an FM modulated wave signal is 76 to 90 MHz. Therefore, when considering the case of using an oscillator having a crystal oscillator of which natural-oscillation frequency $f_0$ is 14 MHz connected thereto, the frequency of a sixth harmonic is 84 MHz. Thus, if a broadcast wave exists in the proximity of this frequency, sensitivity is suppressed by the harmonics so that receiving quality deteriorates.

DISCLOSURE OF THE INVENTION

The present invention was created in view of these points, and an object thereof is to provide a receiver capable of reducing sneaking of noise from a crystal oscillator.

To solve the above-mentioned problem, the receiver according to the present invention has a high-frequency amplifier circuit, a first oscillator, a mixing circuit and a second oscillator. The high-frequency amplifier circuit amplifies a modulated wave signal received via an antenna. The first oscillator generates a predetermined local oscillation signal. The mixing circuit mixes and outputs the modulated wave signal amplified by the high-frequency amplifier circuit and the local oscillation signal outputted from the first oscillator. The second oscillator has the crystal oscillator externally mounted thereon, and performs predetermined oscillation. And a natural-oscillation frequency of the crystal oscillator is set so that a fundamental component and its harmonics will be outside the range of a receiving band of the modulated wave signal. As both the fundamental component and its harmonics of the natural-oscillation frequency of the crystal oscillator are set to be outside the receiving band, the noise sneaking from the crystal oscillator does not appear within the receiving band, and so this type of noise can be reduced.

In particular, it is desirable that the above-mentioned natural-oscillation frequency of the crystal oscillator is set so that the fundamental component and its harmonics are outside the receiving band of the modulated wave signal and also outside a variable range of the oscillation frequency of the first oscillator which is variable in response to the frequency of the modulated wave signal. In the case where the natural-oscillation frequency of the crystal oscillator or the frequency of the harmonics thereof are the same as the frequency of the local oscillation signal, noise may sneak on the modulated wave signal by way of the mixing circuit. Therefore, it is possible to reduce the sneaking of the noise more securely by adding a frequency condition for rendering both the fundamental component and its harmonics of the natural-oscillation frequency of the crystal oscillator outside a variable range of the local oscillation signal.

It is also desirable to integrally form the components of the above-mentioned high-frequency amplifier circuit, mixing circuit, first oscillator and second oscillator except the crystal oscillator on a semiconductor substrate. It is possible, by rendering them as a one-chip component having the circuits constituted on the semiconductor substrate, to reduce the sneaking of the noise among the circuits. Therefore, it is possible to reduce the noise sneaking on the antenna side from the crystal oscillator connected as an external component by devising setting of the above-mentioned natural-oscillation frequency and reduce the sneaking of other noise by rendering the components as one chip so as to significantly reduce various kinds of noise sneaking on the antenna side.

In the case where it further comprises a phase-locked loop circuit constituting a frequency synthesizer together with the first oscillator, it is desirable to integrally form the phase-locked loop circuit on the above-mentioned semiconductor substrate. It is thereby possible to securely prevent the local oscillation signal inputted to the phase-locked loop circuit from the first oscillator and the its harmonics thereof from sneaking on the input side of the high-frequency amplifier circuit or the mixing circuit.

BEST MODE FOR CARRYING OUT THE INVENTION

Hereafter, an FM receiver according to an embodiment of the present invention will be described in detail.

Figure 1:
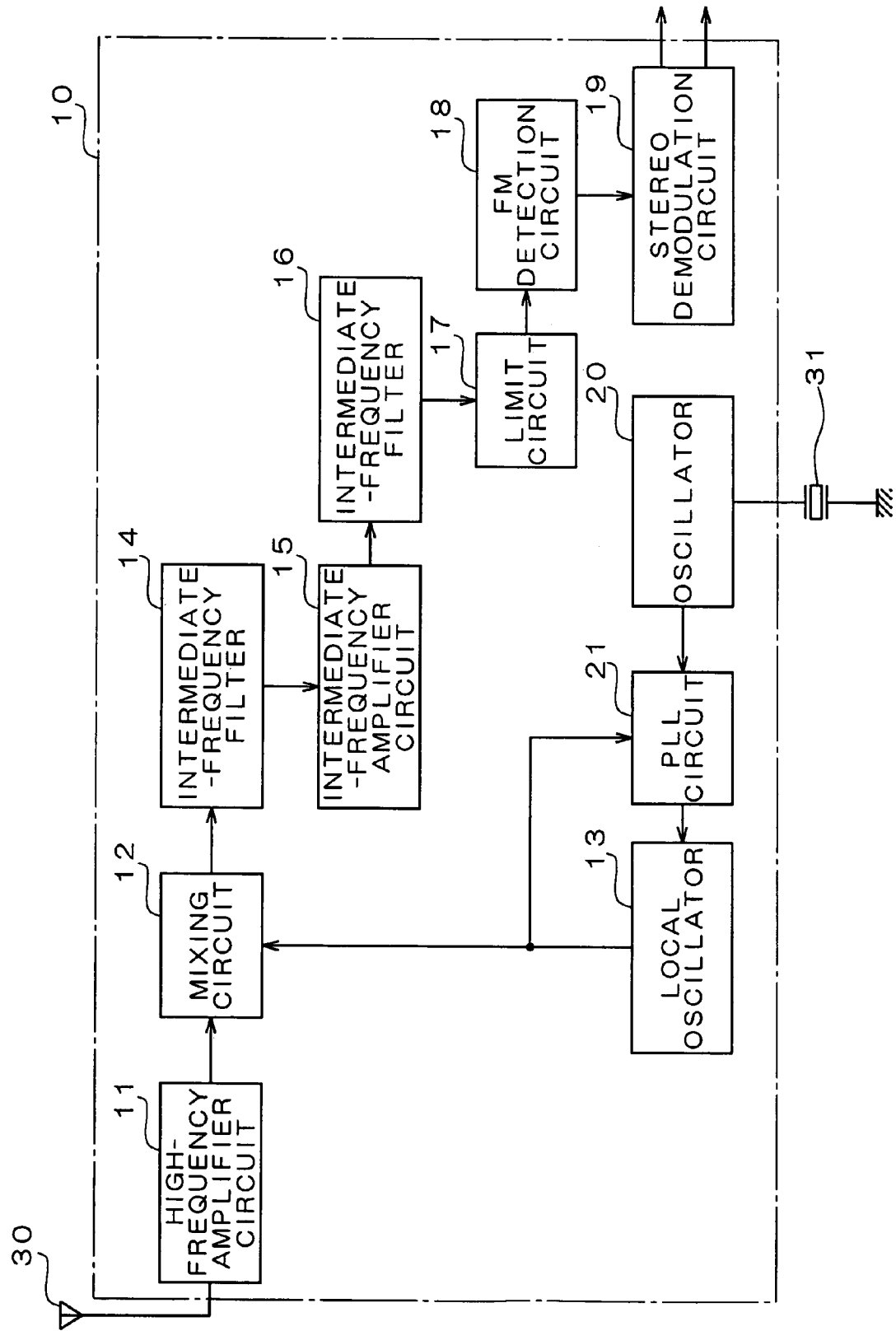
FIG. 1 is a diagram showing a configuration of the FM receiver according to this embodiment.

FIG. 1 is a diagram showing a configuration of the FM receiver according to this embodiment. The FM receiver shown in FIG. 1 is comprised of a high-frequency amplifier circuit 11, a mixing circuit 12, a local oscillator 13, intermediate-frequency filters 14, 16, an intermediate-frequency amplifier circuit 15, a limit circuit 17, an FM detection circuit 18 and a stereo demodulation circuit 19, an oscillator 20 and a PLL (Phase-Locked Loop) circuit 21 which are formed as a one-chip component 10.

After amplifying an FM modulated wave signal received by an antenna 30 with the high-frequency amplifier circuit 11, a high-frequency signal is converted into an intermediate-frequency signal by mixing it with a local oscillation signal outputted from the local oscillator 13. For instance, if a carrier frequency of the modulated wave signal outputted from the high-frequency amplifier circuit 11 is $f_1$ and the frequency of the local oscillation signal outputted from the local oscillator 13 is $f_2$, an intermediate-frequency signal having the frequency of $f_1-f_2$ is outputted from the mixing circuit 12.

The intermediate-frequency filters 14 and 16 are provided to a preceding stage and a subsequent stage to the intermediate-frequency amplifier circuit 15, and extract only a predetermined band component from an inputted intermediate-frequency signal. The intermediate-frequency amplifier circuit 15 amplifies some intermediate-frequency signals passing through the intermediate-frequency filters 14 and 16.

The limit circuit 17 amplifies the inputted intermediate-frequency signal with a high gain. The FM detection circuit 18 performs FM detection to a signal of fixed amplitude outputted from the limit circuit 17. The stereo demodulation circuit 19 performs stereo demodulation to a composite signal after the FM detection outputted from the FM detection circuit 18 so as to generate an L signal and an R signal.

The oscillator 20 uses a crystal oscillator 31 connected as an external component as a resonant circuit, and performs oscillation at a natural-oscillation frequency $f_0$ (in reality, a resonance frequency $f_r$ which is a little higher) of the crystal oscillator 31. The PLL circuit 21 constitutes a frequency synthesizer together with the local oscillator 13, and uses the signal outputted from an oscillator 20 as a reference signal so as to exert control to cause the local oscillator 13 to oscillate at the frequency N times higher than that of this reference signal. The value N can be arbitrarily changed by a control section (not shown) so that the oscillation frequency of the local oscillator 13 is switched by switching the value N.

The above-mentioned one-chip component 10 according to this embodiment is integrally formed on a semiconductor substrate by using CMOS process, MOS process or another semiconductor process.

The crystal oscillator 31 included in the FM receiver according to this embodiment has a natural-oscillation frequency $f_0$ set up so that a fundamental component and its harmonics will be outside the range of a receiving band of the modulated wave signal.

Figure 2:
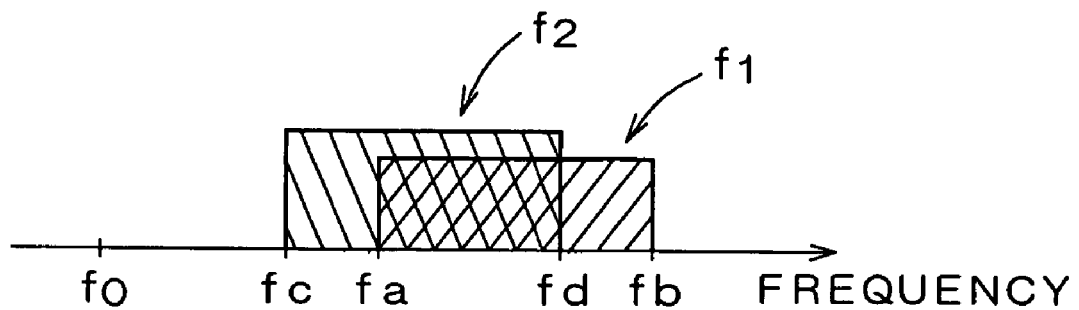
FIG. 2 is a diagram showing a relationship between the natural-oscillation frequency of the crystal oscillator and the receiving band.

FIG. 2 is a diagram showing a relationship between the natural-oscillation frequency of the crystal oscillator and the receiving band. In FIG. 2, a horizontal axis indicates the frequency. In FIG. 2, the natural-oscillation frequency $f_0$ of the crystal oscillator 31 is set up so that neither the fundamental component nor its harmonics will be included in receiving bands fa to fb which are a variable range of the frequency $f_1$ of the modulated wave signal.

Therefore, a frequency $m \times f_0$ of an m-th order harmonic should be less than a lower limit fa of the receiving band, and a frequency $(m+1) \times f_0$ of an (m+1)-th order harmonic should be a value larger than a upper limit fb thereof. Because of these requirements, both the following equations should be satisfied.

$$f_0 < fa/m$$

$$f_0 > fb/(m+1)$$

To be more specific, the crystal oscillator 31 having the value of $f_0$ satisfying the following should be used.

$$fb/(m+1) < f_0 < fa/m$$

For instance, when considering an FM broadcast in Japan, it is fa=76 MHz, fb=90 MHz so that it will be as follows in the case of substituting values from 1 for the values of m in order.

If m=1: 90/2<$f_0$<76, that is, $f_0$ should be set within the range of 45 to 76 MHz.

If m=2: 90/3<$f_0$<76/2, that is, $f_0$ should be set within the range of 30 to 38 MHz.

If m=3: 90/4<$f_0$<76/3, that is, $f_0$ should be set within the range of 22.5 to 25.33 MHz.

If m=4: 90/5<$f_0$<76/4, that is, $f_0$ should be set within the range of 18 to 19 MHz.

If m=5: 90/6<$f_0$<76/5, that is, $f_0$ should be set within the range of 15 to 15.2 MHz.

Incidentally, according to the above description, neither the fundamental component nor harmonics of the natural-oscillation frequency $f_0$ of the crystal oscillator 31 are included in the receiving bands. However, it is preferable that these components are not included in the variable range of the local oscillation signal outputted from the local oscillator 13 either. To be more specific, in the case where the above-mentioned fundamental component and its harmonics are included in the variable range of the local oscillation signal, these components become noise and get mixed with the intermediate-frequency signal through the mixing circuit 12. Therefore, to prevent mixture of such noise, this embodiment has the natural-oscillation frequency $f_0$ of the crystal oscillator 31 set up so that neither the fundamental component nor its harmonics will be included in frequency ranges fc to fd which are the variable range of the frequency $f_2$ of the local oscillation signal.

To be more precise, as with the above-mentioned receiving bands of the modulated wave signal, the crystal oscillator 31 having the value of $f_0$ satisfying the following should be used.

$$fd/(m+1) < f_0 < fc/m$$

When considering the above-mentioned FM broadcast in Japan for instance, if the frequency $f_2$ of the local oscillation signal is set to be lower than the frequency $f_1$ of the modulated wave signal by 10.7 MHz, it is fc=65.3 MHz, fd=79.3 MHz so that it will be as follows in the case of substituting values from 1 for the values of m in order.

If m=1: 79.3/2<$f_0$<65.3, that is, $f_0$ should be set within the range of 39.65 to 65.3 MHz.

If m=2: 79.3/3<$f_0$<65.3/2, that is, $f_0$ should be set within the range of 26.43 to 32.65 MHz.

If m=3: 79.3/4<$f_0$<65.3/3, that is, $f_0$ should be set within the range of 19.83 to 21.77 MHz.

If m=4: 79.3/5<$f_0$<65.3/4, that is, $f_0$ should be set within the range of 15.86 to 16.33 MHz.

From the above results, the crystal oscillator 31 of which natural-oscillation frequency $f_0$ is included in the range of 45 to 65.3 MHz or 30 to 32.65 MHz should be selected and used.

Thus, the FM receiver according to this embodiment has both the fundamental component and its harmonics of the natural-oscillation frequency $f_0$ of the crystal oscillator 31 set up to be outside the range of a receiving band of the modulated wave signal. Therefore, the noise sneaking from the crystal oscillator 31 does not appear within the receiving band, and so this type of noise can be reduced. Furthermore, it is possible to reduce the sneaking of the noise more securely by adding a frequency condition for rendering both the fundamental component and its harmonics of the natural-oscillation frequency $f_0$ of the crystal oscillator 31 outside the variable range of the local oscillation signal.

Moreover, it is possible to reduce the noise sneaking on the antenna side from the crystal oscillator 31 connected as the external component by devising setting of the above-mentioned natural-oscillation frequency $f_0$ and reduce the sneaking of other noise by rendering the components as one chip so as to significantly reduce various kinds of noise sneaking on the antenna side.

Furthermore, it is possible, by rendering them as one-chip including the PLL circuit 21 constituting a frequency synthesizer together with the local oscillator 13, to securely prevent the local oscillation signal outputted from the local oscillator 13 and its harmonics thereof from sneaking on the input side of the high-frequency amplifier circuit 11 or the mixing circuit 12.

The present invention is not limited to the above embodiment, but various modified embodiments are possible within the range of the gist thereof. For instance, the above embodiment described the FM receiver. However, the present invention is also applicable to various receivers such as an AM receiver and a data terminal device, transmitters or communication devices.

According to the above-mentioned embodiment, the fundamental component and its harmonics of the natural-oscillation frequency $f_0$ of the crystal oscillator 31 are included in neither the receiving band of the modulated wave signal nor the variable range of the local oscillation signal. However, it is also possible to select the crystal oscillator 31 considering only the receiving band. In fact, it is considered that deterioration in quality due to the sneaking of the noise from the crystal oscillator 31 is mainly caused by the mixture of the noise with a feeble modulated wave signal. Therefore, it is possible, just by considering the receiving band, to significantly eliminate bad influence of the noise sneaking from the crystal oscillator 31. Furthermore, it becomes possible, just by considering the receiving band, to expand the range of selection of the crystal oscillator 31 so as to increase the freedom of design.

INDUSTRIAL APPLICABILITY

As described above, according to the present invention, both the fundamental component and its harmonics of the natural-oscillation frequency of the crystal oscillator are set to be outside the receiving band, and thus the noise sneaking from the crystal oscillator does not appear within the receiving band so that this type of noise can be reduced.

The invention claimed is:

1. A receiver having a high-frequency amplifier circuit for amplifying a modulated wave signal received via an antenna, a first oscillator for generating a predetermined local oscillation signal, a mixing circuit for mixing and outputting a modulated wave signal amplified by said high-frequency amplifier circuit and a local oscillation signal outputted from said first oscillator, and a second oscillator having a crystal oscillator externally mounted thereon for performing predetermined oscillation, characterized in that a natural-oscillation frequency of said crystal oscillator is set so that a fundamental component and its harmonics are outside the range of a receiving band of said modulated wave signal, and also outside a variable range of the oscillation frequency of said first oscillator which is variable in response to the frequency of said modulated wave signal.

2. The receiver according to claim 1, characterized in that components of said high-frequency amplifier circuit, said mixing circuit, said first oscillator and said second oscillator except said crystal oscillator are integrally formed on a semiconductor substrate.

3. The receiver according to claim 2, characterized in that it further comprises a phase-locked loop circuit constituting a frequency synthesizer together with said first oscillator, and said phase-locked loop circuit is integrally formed on said semiconductor substrate.

* * * * *